(12) United States Patent
Gaff et al.

(10) Patent No.: US 8,449,174 B2
(45) Date of Patent: *May 28, 2013

(54) METHOD AND APPARATUS FOR CHUCK THERMAL CALIBRATION

(75) Inventors: Keith William Gaff, Fremont, CA (US); Neil Martin Paul Benjamin, East Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 12/858,408

(22) Filed: Aug. 17, 2010

(65) Prior Publication Data

US 2010/0309604 A1    Dec. 9, 2010

Related U.S. Application Data

(62) Division of application No. 11/198,489, filed on Aug. 5, 2005, now Pat. No. 7,802,917.

(51) Int. Cl.
*G01K 7/00* (2006.01)
*G01K 17/00* (2006.01)

(52) U.S. Cl.
USPC ............ 374/1; 374/178; 374/134; 374/143; 374/5; 374/44; 438/9

(58) Field of Classification Search
USPC ............. 374/1, 141, 142, 143, 178, 44, 45, 374/120, 121, 43, 39, 30, 100, 102, 112, 374/115, 134, 137, 163, 166, 167, 169, 2; 702/130, 99; 361/600; 438/5, 9, 54
See application file for complete search history.

(56) References Cited

U.S. PATENT DOCUMENTS

| | | | | |
|---|---|---|---|---|
| 4,913,929 A | * | 4/1990 | Moslehi et al. | 427/564 |
| 5,876,119 A | * | 3/1999 | Ishikawa et al. | 374/134 |
| 5,911,833 A | * | 6/1999 | Denison et al. | 134/1.1 |
| 5,992,046 A | * | 11/1999 | Weigand et al. | 34/493 |
| 5,996,415 A | * | 12/1999 | Stanke et al. | 73/597 |
| 6,112,595 A | * | 9/2000 | Stanke et al. | 73/597 |
| 6,361,645 B1 | * | 3/2002 | Schoepp et al. | 361/234 |
| 6,610,968 B1 | * | 8/2003 | Shajii et al. | 219/497 |
| 6,853,953 B2 | * | 2/2005 | Brcka et al. | 702/182 |
| 7,138,606 B2 | * | 11/2006 | Kanno et al. | 219/390 |
| 7,299,148 B2 | * | 11/2007 | Hunt et al. | 702/130 |

(Continued)

FOREIGN PATENT DOCUMENTS

| JP | 2001092501 A | * | 4/2001 |
|---|---|---|---|
| JP | 2003272991 A | * | 9/2003 |

*Primary Examiner* — Gail Verbitsky
(74) *Attorney, Agent, or Firm* — Martine Penilla Group, LLP

(57) ABSTRACT

Wafer temperature is measured as a function of time following removal of a heat source to which the wafer is exposed. During the wafer temperature measurements, a gas is supplied at a substantially constant pressure at an interface between the wafer and a chuck upon which the wafer is supported. A chuck thermal characterization parameter value corresponding to the applied gas pressure is determined from the measured wafer temperature as a function of time. Wafer temperatures are measured for a number of applied gas pressures to generate a set of chuck thermal characterization parameter values as a function of gas pressure. A thermal calibration curve for the chuck is generated from the set of measured chuck thermal characterization parameter values and the corresponding gas pressures. The thermal calibration curve for the chuck can be used to tune the gas pressure to obtain a particular wafer temperature during a fabrication process.

9 Claims, 6 Drawing Sheets

U.S. PATENT DOCUMENTS

| | | | |
|---|---|---|---|
| 7,802,917 B2 * | 9/2010 | Gaff et al. | 374/143 |
| 7,941,039 B1 * | 5/2011 | Shrinivasan et al. | 392/416 |
| 7,960,297 B1 * | 6/2011 | Rivkin et al. | 438/800 |
| 8,047,706 B2 * | 11/2011 | Goodman et al. | 374/1 |
| 2003/0033116 A1 * | 2/2003 | Brcka et al. | 702/182 |
| 2003/0067734 A1 * | 4/2003 | Nakano | 361/234 |
| 2004/0150416 A1 * | 8/2004 | Cowan et al. | 324/754 |
| 2004/0188021 A1 * | 9/2004 | Mitrovic | 156/345.52 |
| 2005/0052817 A1 * | 3/2005 | Kellerman et al. | 361/234 |
| 2007/0035908 A1 * | 2/2007 | Kitsunai et al. | 361/234 |
| 2009/0025876 A1 * | 1/2009 | Magni | 156/345.27 |
| 2010/0149720 A1 * | 6/2010 | Fujisawa et al. | 361/234 |
| 2011/0291680 A1 * | 12/2011 | Rumiantsev et al. | 324/750.02 |

* cited by examiner

METHOD AND APPARATUS FOR CHUCK THERMAL CALIBRATION

CLAIM OF PRIORITY

This application is a divisional application of U.S. patent application Ser. No. 11/198,489, filed on Aug. 5, 2005 now U.S. Pat. No. 7,802,917, the disclosure of which is incorporated in its entirety herein by reference.

BACKGROUND

Semiconductor wafer ("wafer") fabrication often includes exposing a wafer to a plasma to allow the reactive constituents of the plasma to modify the surface of the wafer, e.g., removal material from unprotected areas of the wafer surface. The resulting wafer characteristics following the plasma fabrication process are dependent on the process conditions, including the plasma characteristics and wafer temperature. For example, in some plasma processes a critical dimension, i.e., feature width, on the wafer surface can vary by about one nanometer per degree Celsius of wafer temperature. It should be appreciated that differences in wafer temperature between otherwise identical wafer fabrication processes will result in different wafer surface characteristics. Thus, a drift in process results between different wafers can be caused by variations in wafer temperature during plasma processing.

A general objective in wafer fabrication is to fabricate each wafer of a given type in as identical a manner as possible. To meet this wafer-to-wafer uniformity objective, it is necessary to control fabrication parameters that influence the resulting wafer characteristics. Therefore, it is necessary to control the wafer temperature during the plasma fabrication process. Current plasma processing devices for wafer fabrication do not include effective wafer temperature control capabilities. Therefore, a need exists for accurate control of wafer temperature during a plasma fabrication process.

SUMMARY

It should be appreciated that the present invention can be implemented in numerous ways, such as a process, an apparatus, a system, a device or a method. Several inventive embodiments of the present invention are described below.

In one embodiment, a method is disclosed for performing a thermal calibration of a chuck. The method includes an operation for supporting a wafer on the chuck in exposure to a heat source. The method continues with an operation for applying a gas at a substantially constant pressure at an interface between the wafer and the chuck. Then, the heat source is removed. Following removal of the heat source, a temperature of the wafer as a function of time is measured while maintaining the applied gas pressure. The method further includes an operation for determining a chuck thermal characterization parameter value based on the measured temperature of the wafer as a function of time. The determined chuck thermal characterization parameter value is directly correlated to the applied gas pressure. The aforementioned method operations are repeated for a number of different applied gas pressures to generate a set of chuck thermal characterization parameter values as a function of gas pressure. A correlation is then established between the measured chuck thermal characterization parameter values and the corresponding gas pressures to generate a thermal calibration curve for the chuck. It should be appreciated that using the generated thermal calibration curve for the chuck, a gas pressure can be determined for a particular chuck thermal characterization parameter value, vice-versa. Additionally, the thermal characterization parameter represented in the thermal calibration curve for the chuck can be directly correlated to wafer temperatures during the wafer fabrication process.

In another embodiment, a method for controlling wafer temperature during a wafer fabrication process is disclosed. The method includes an operation for determining a target thermal characterization parameter value for a chuck. It should be appreciated that the chuck is to be used to hold the wafer during the wafer fabrication process. The method further includes an operation for examining a thermal calibration curve for the chuck to determine a backside gas pressure value corresponding to the chuck target thermal characterization parameter. It should be understood that the backside gas pressure corresponds to a pressure of a gas applied at an interface between the wafer and the chuck. The method further includes an operation for setting the backside gas pressure to the value corresponding to the chuck target thermal characterization parameter value. It should be appreciated that the backside gas pressure serves to control the wafer temperature during the fabrication process.

In another embodiment, a system is disclosed for providing wafer temperature control during a wafer fabrication process. The system includes a chuck defined to hold a wafer in exposure to a plasma. The chuck includes a number of ports to supply a gas at an interface between the wafer and the chuck. The system also includes a gas controller defined to control a pressure of the gas supplied at the interface between the wafer and the chuck. The system further includes a computing device for controlling the gas controller. The computing device includes thermal calibration data for the chuck, wherein the thermal calibration data specifies a gas pressure setting to be communicated from the computing device to the gas controller to maintain a target wafer temperature.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
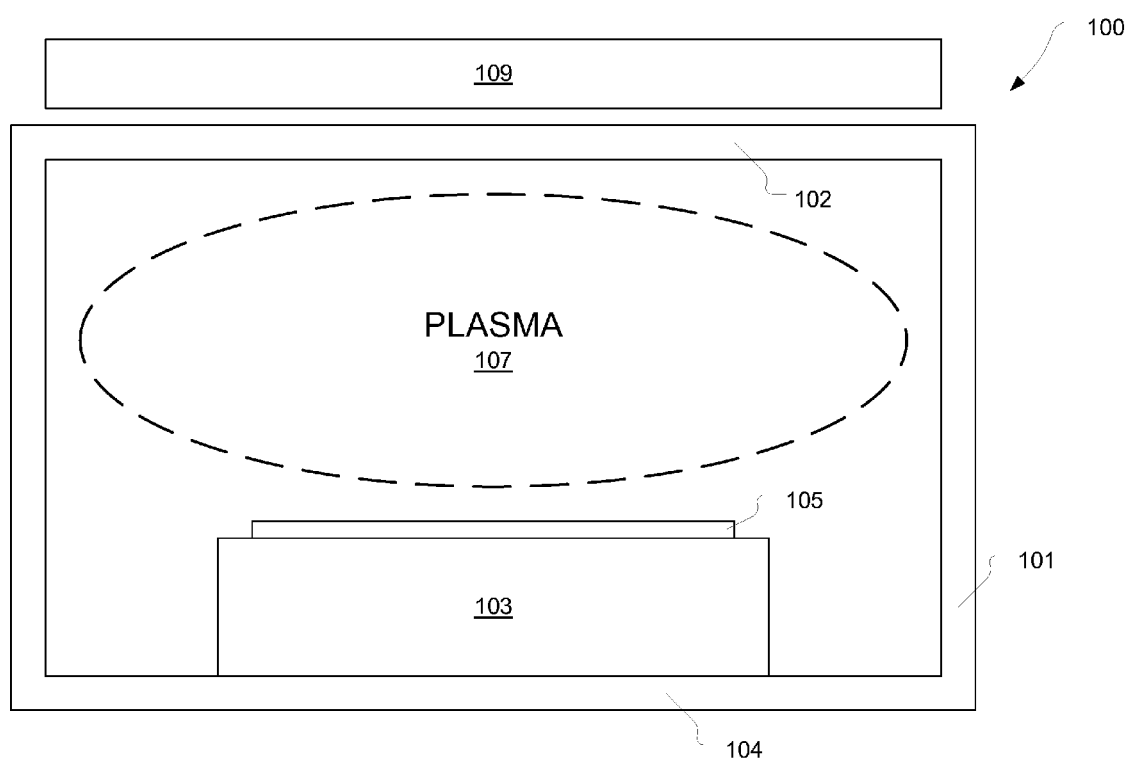
FIG. 1 is an illustration showing a generalized representation of a plasma chamber for semiconductor wafer processing, in accordance with one embodiment of the present invention.

FIG. 1 is an illustration showing a generalized representation of a plasma chamber 100 for semiconductor wafer ("wafer" hereafter) processing, in accordance with one embodiment of the present invention. The chamber 100 is defined by surrounding walls 101, a top 102, and a bottom 104. A chuck 103 is disposed within the chamber 100 to hold the wafer 105 in exposure to a plasma 107 to be generated within the chamber 100. In one embodiment, the chuck 103 is defined as an electrostatic chuck (ESC) capable of being electrically charged to attract ions in the plasma 107 toward the wafer 105. In one embodiment, a coil 109 is defined above the chamber to provide energy for generating the plasma 107 within the chamber internal volume.

During operation, a reactant gas flows through the chamber 100 from a gas lead-in port (not shown) to a gas exhaust port (not shown). High frequency power (i.e., RF power) is then applied from a power supply (not shown) to the coil 109 to cause an RF current to flow through the coil 109. The RF current flowing through the coil 109 generates an electromagnetic field about the coil 109. The electromagnetic field generates an inductive current within the etching chamber 100 internal volume. The inductive current acts on the reactant gas to generate the plasma 107. During the etching process, the coil 109 performs a function analogous to that of a primary coil in a transformer, while the plasma 107 performs a function analogous to that of a secondary coil in the transformer.

The plasma 107 is enveloped by a sheath of non-plasma reactant gas. Therefore, high frequency power (i.e., RF power) is applied from a power supply through matching circuitry to the chuck 103 to provide directionality to the plasma 107 such that the plasma 107 is "pulled" down onto the wafer 105 surface to effect the etching process. The plasma 107 contains various types of radicals in the form of positive and negative ions. Chemical reactivity of the various types of positive and negative ions are used to etch the wafer 105.

Figure 2:
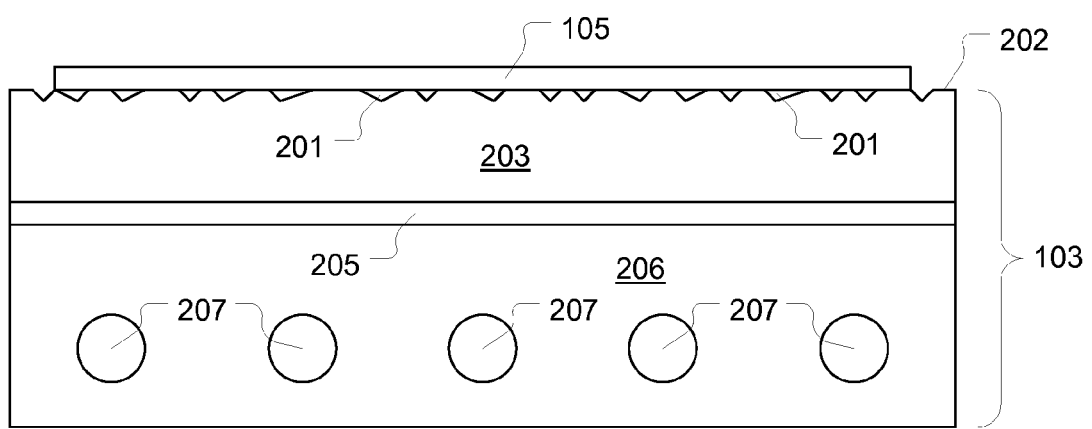
FIG. 2 is an illustration showing a vertical cross-section view of the chuck, in accordance with one embodiment of the present invention.

FIG. 2 is an illustration showing a vertical cross-section view of the chuck 103, in accordance with one embodiment of the present invention. The chuck 103 is defined by multiple material regions including a ceramic layer 203, an adhesive layer 205, and an aluminum layer 206. The chuck 103 also includes a number of cooling channels through which a liquid coolant, e.g., water, flows. The wafer 105 is held on a surface 202 of the chuck 103 during plasma processing. In one embodiment, mechanical force is used to hold the wafer 105 on the surface 202. In another embodiment, electrical force is used to attract the wafer 105 to the surface 202 and hold the wafer 105 during processing.

To avoid unnecessarily obscuring the present invention additional features of the chuck 103 have not been shown in FIG. 2. For example, in addition to the fluid coolant channels 207, the chuck 103 also includes gas coolant channels defined to direct a gas coolant to regions between the wafer 105 and the surface 202 of the chuck 103. Furthermore, it should be appreciated that the fluid and gas coolant channels of the chuck can be configured in essentially any arrangement necessary to produce a desired operational effect. Additionally, the chuck 103 can be defined to include a number of lifting pins to assist in chucking and de-chucking of the wafer 105. Furthermore, it should be understood that the chuck can be electrically connected to a power source through matching circuitry to provide the plasma 107 directional bias and/or electrical wafer clamping force as previously mentioned. Thus, the chuck 103 is actually a complex device that includes more components than explicitly shown in FIG. 2.

Wafer characteristics following plasma processing are typically dependent upon a temperature of the wafer during the plasma processing. For example, in some plasma processes a critical dimension, i.e., feature width, on the wafer can vary by about one nanometer per degree Celsius of wafer temperature. Additionally, a drift in process results between different wafers can be caused by variations in wafer temperature during the plasma processing of the different wafers. A general objective in wafer fabrication is to fabricate each wafer of a given type in as identical a manner as possible. Therefore, to meet this wafer-to-wafer uniformity objective, it is necessary to control fabrication parameters that influence the resulting wafer characteristics. Obviously, the plasma conditions will directly affect the resulting wafer characteristics. However, as previously mentioned, the wafer temperature during the plasma process will also directly affect the resulting wafer characteristics.

In addition to holding the wafer 105 and serving as a mechanism for directionally biasing the plasma 107, the chuck 103 also acts as the primary mechanism for controlling a temperature of the wafer 105 during processing. During operation, heat flux emanating from the plasma 107 is directed toward the wafer 105. Thermal energy absorbed by the wafer 105, is conducted from the wafer through the various regions of the chuck 103 to the fluid coolant within the coolant channels 207. Thus, the fluid coolant within the coolant channels 207 serves as a primary heat sink. Therefore, it should be appreciated that a temperature of the wafer 105 during processing is not only dependent upon the heat flux emanating from the plasma 107, but is also dependent upon the thermal characteristics of the chuck 103, i.e., how heat is conducted from the wafer 105 to the heat sink.

With respect to the chuck 103 representation of FIG. 2, heat is conducted from the wafer 105 to the fluid within the coolant channels 207, via conduction through the various chuck 103 materials therebetween. At least two paths exist for thermal conduction between the wafer 105 and the ceramic layer 203. In one path, heat is conducted directly from the wafer 105 to the ceramic layer 203 via physical contact. In another path, heat is conducted through gas present within gaps 201 between the wafer 105 and the ceramic layer 203. The gaps 201 result from the random microscopic surface roughness of the chuck 103 and/or engineered surface topography such as bumps. It should be appreciated that a size of the gaps 201 in FIG. 2 is exaggerated for ease of discussion. The conduction through the gas within the gaps 201 is dependent upon the gas pressure and the gap 201 characteristics. In one embodiment, gas, e.g., helium, is provided to the gaps 201 through ports on the surface 202. The gas pressure can be controlled to adjust the amount of thermal conduction through the gas-filled gaps 201.

The ratio of wafer-to-ceramic heat transfer through direct conduction versus gap conduction is a function of the surface 202 characteristics of the chuck 103 and the pressure and type of gas present in the gaps 201. Heat transfer via gap conduction is expected to appreciably influence the overall heat transfer between the wafer 105 and the ceramic layer 201 when gas is present in the gaps 201. It should be noted that the amount of heat transfer via gap conduction is a function of the portion of total chuck surface area underlying the wafer that is in contact with the wafer, physical characteristics of the gaps, type of gas present within the gaps, and pressure of gas present within the gaps. The amount of gaps and physical properties of the gaps, i.e., size and shape of the gaps, can be characterized by a surface roughness parameter and/or the fraction of the area in contact with the wafer.

It will be appreciated by those skilled in the art that the surface roughness parameter can be represented as a root-mean-square (RMS) surface roughness measurement. In one embodiment, surface 202 of the chuck 103 is defined to have a RMS surface roughness within a range extending from about 5 microinches to about 200 microinches. In a more preferred embodiment, surface 202 of the chuck 103 is defined to have a RMS surface roughness within a range extending from about 20 microinches to about 100 microinches. In an alternative embodiment, the surface 202 of the chuck 103 can be defined to include engineered gaps. The engineering gaps can be configured to enhance the influence of gap conductance on the overall heat transfer between the wafer 105 and the ceramic layer 203.

Referring back to the chuck 103 of FIG. 2, heat is conducted from the ceramic layer 203 to the adhesive layer 205. From the adhesive layer 205, heat is conducted to the aluminum layer 206. Heat is then conducted from the aluminum layer 206 to the fluid within the coolant channels 207. In a preferred embodiment, the fluid within the coolant channels 207 effectively performs as a perfect heat sink. It should be appreciated that the fluid type, fluid temperature, and fluid flow rate within the coolant channels 207 can be defined to approach the performance of the perfect heat sink.

Many parameters that influence heat transfer characteristics of the chuck 103 are invariable with time and use. For example, a thickness of the adhesive layer 205 and a mass of the aluminum layer 206 are not expected to change with time. However, it should be understood that the as-fabricated values for such invariable heat transfer characteristics of the chuck 103 can differ from one chuck to another. Therefore, different chucks may have different initial thermal characteristics. Additionally, the manner in which different chucks are installed can affect the thermal performance of the chuck during plasma processing. Furthermore, it should be appreciated that some chuck properties are subject to change as a function of use. As a consequence, the thermal performance of the chuck may change as a function of use, and cause a corresponding change in the wafer temperature. Due to the direct influence of the chuck thermal performance on the wafer temperature, it is important to understand and control the chuck thermal performance during wafer processing.

As previously discussed, one property of the chuck that is subject to change and that can significantly affect the wafer temperature is the surface roughness of the chuck surface interfacing with the wafer ("interfacing surface"). During use, the interfacing surface roughness can be modified by various processes, such as a waferless auto clean process. Additionally, with extended use, the wafer itself can modify the interfacing surface roughness through physical wear. To maintain a consistent thermal interface between the wafer and the chuck, it is necessary to quantify the interfacing surface roughness and any modification thereof.

Figure 3:
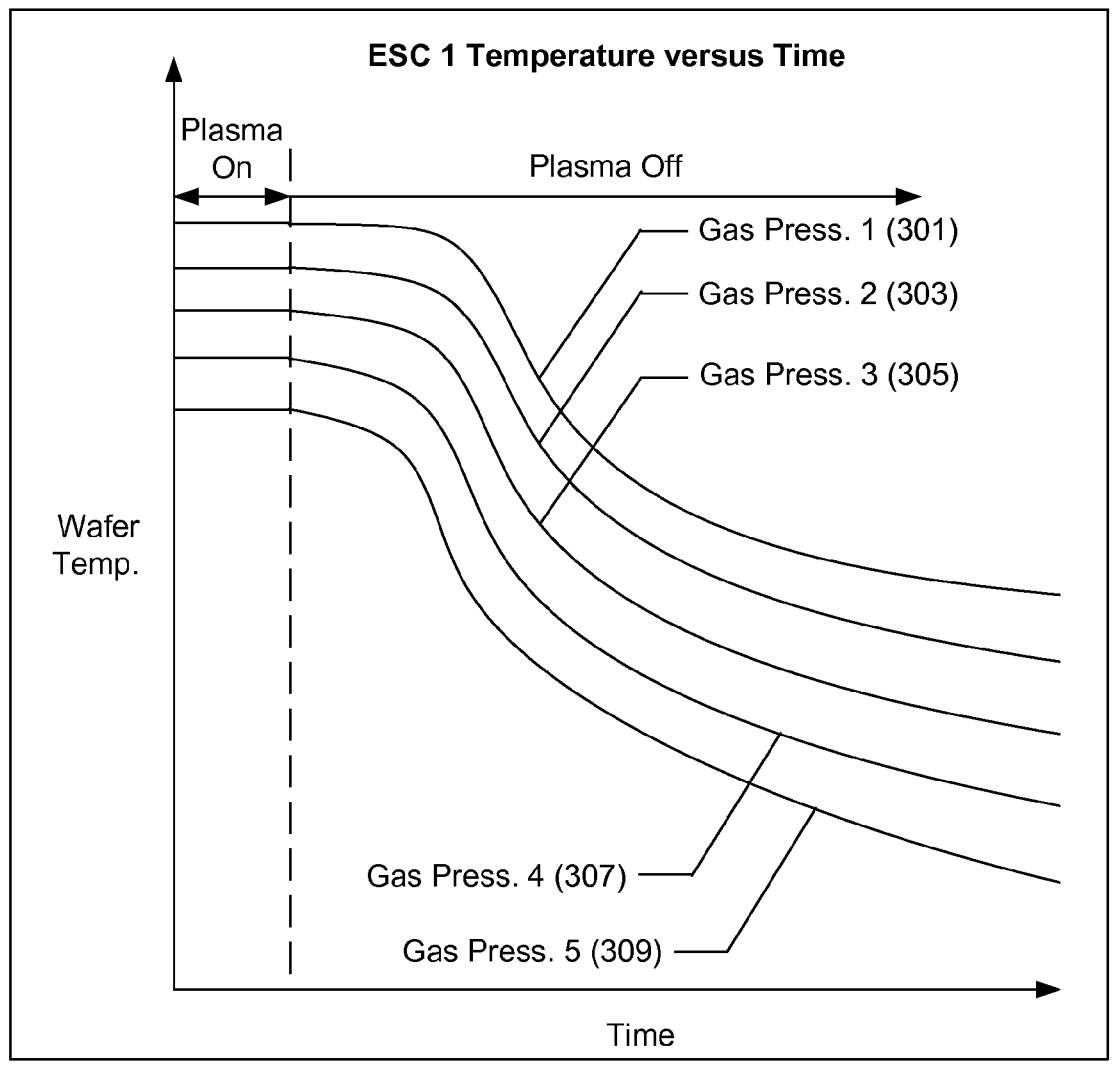
FIG. 3 is an illustration showing transient wafer temperature measurements for a chuck designated "ESC 1" at various backside gas pressures, in accordance with one embodiment of the present invention.

The present invention provides a method for quantifying the thermal characteristics of the chuck 103, including the wafer-to-chuck interface, in order to maintain a target wafer temperature during plasma processing. In one embodiment, a transient response of the wafer temperature to a change in plasma power is measured for different backside gas pressures, wherein the backside gas pressure corresponds to the gas pressure within the gaps 201 at the interface between the wafer 105 and the chuck 103. FIG. 3 is an illustration showing transient wafer temperature measurements for a chuck designated "ESC 1" at various backside gas pressures, in accordance with one embodiment of the present invention. Measurement of the wafer temperature transient response at each backside gas pressure begins by measuring the wafer temperature in the presence of a stead-state plasma 107. With respect to FIG. 3, the presence of the steady-state plasma is designated by "Plasma On." Then, the plasma is turned off and the temperature of the wafer is measured as a function of cooling time for each gas pressure (301-309). With respect to FIG. 3, the absence of the plasma is designated by "Plasma Off."

When the plasma is present, the wafer temperature is essentially at steady state. When the plasma is turned off, the wafer temperature drops according the heat transfer characteristics of the chuck 103. It should be appreciated that when evaluating the thermal performance of the chuck 103 in the absence of the plasma, it is not necessary to consider a heat flux contribution from the plasma to the wafer. Therefore, the transient behavior of the wafer temperature after the plasma is turned off can be directly attributed to the chuck 103 thermal characteristics. Once the wafer temperature measurements are obtained, a curve fit can be made to the temperature versus time data for each backside gas pressure. With respect to FIG. 3, five backside gas pressures are evaluated as represented by curves 301-309. The wafer temperature versus time curves are analyzed to determine a thermal characterization parameter value for the chuck 103. In one embodiment, the thermal characterization parameter for the chuck 103 is represented as an effective thermal conductivity of the chuck 103. In another embodiment, the thermal characterization parameter for the chuck 103 is represented as a derived parameter, e.g., time constant, that characterizes the thermal performance of the chuck 103. The chuck thermal characterization parameter value determined for each of the temperature versus time curves corresponds to the associated backside gas pressure. It should be appreciated that the transient wafer temperature response to plasma power shut off for different backside gas pressures is determined for each chuck of interest.

Figure 4:
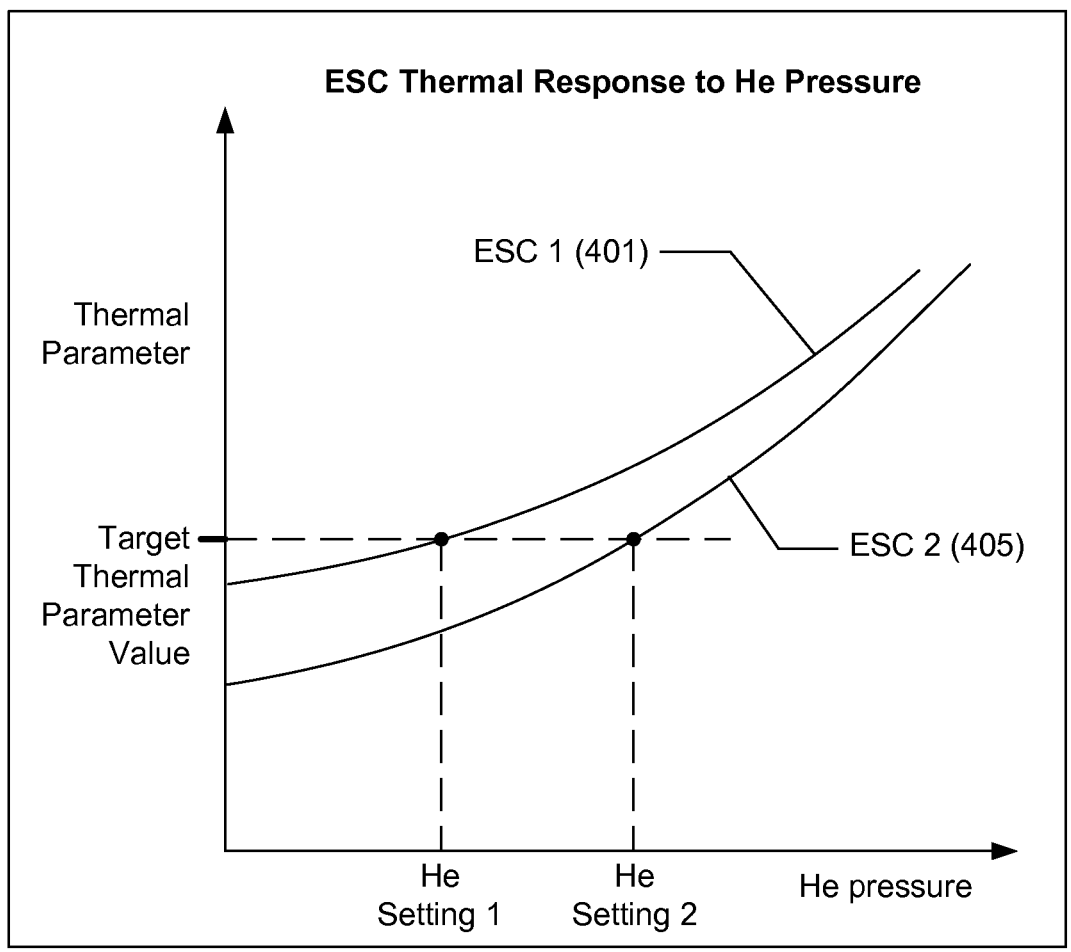
FIG. 4 is an illustration showing exemplary thermal characterization parameter versus backside gas pressure curves, in accordance with one embodiment of the present invention.

The measured thermal characterization parameter values for the various backside gas pressures, as determined from the transient wafer temperature response curves such as those shown in FIG. 3, are used to generate a thermal characterization parameter versus backside gas pressure curve for the corresponding chuck. FIG. 4 is an illustration showing exemplary thermal characterization parameter versus backside gas pressure curves, in accordance with one embodiment of the present invention. For ease of discussion, the thermal characterization parameter versus backside gas pressure curve for a given chuck is referred to as a "thermal calibration curve." FIG. 4 shows thermal calibration curves 401 and 405 for each of two chucks designated "ESC 1" and "ESC 2", respectively. It should be appreciated that the difference in slope between the thermal calibration curves of ESC 1 and ESC 2 is due to differences in the wafer interfacing surface roughness of each chuck. For example, the chuck having a surface roughness that allows for more gap exposure at the backside of the wafer can be expected to exhibit a stronger influence of backside gas pressure on wafer temperature.

The thermal calibration curves for each chuck can be used to determine a chuck-specific backside gas pressure corresponding to a particular target thermal parameter value, wherein the target thermal parameter value represents a target chuck thermal performance. It should be appreciated that different chucks having their backside gas pressures tuned to the same target thermal parameter value will have a substantially similar overall heat transfer capability. Thus, wafer temperatures associated with the different chucks tuned to the same target thermal parameter value will be substantially similar. Therefore, the thermal calibration curves for various chucks can be used to tune the various chucks, via backside gas pressure, in order to match wafer temperatures during plasma processing. The required backside gas pressure for a particular chuck to obtain a target heat transfer capability can be specified explicitly or as a pressure offset relative to an initial backside gas pressure specified for the chuck. In one embodiment, the backside gas is helium and is controllable within a pressure range extending from about 5 ton to about 100 ton.

In another embodiment, the chuck thermal performance can be calibrated with respect to multiple thermal characterization parameters. For example, the backside gas pressure can be considered in combination with one or more additional parameters, e.g., chuck chiller temperature or chuck heater temperature, when calibrating the thermal performance of the chuck. In this embodiment, different chucks having the combination of backside gas pressure and additional parameter(s) tuned to achieve the same target thermal performance will have a substantially similar overall heat transfer capability, resulting in substantially similar wafer temperatures. Therefore, the present invention also provides for use of multiple-parameter thermal calibration data to tune various chucks to match wafer temperatures during plasma processing.

Figure 5:
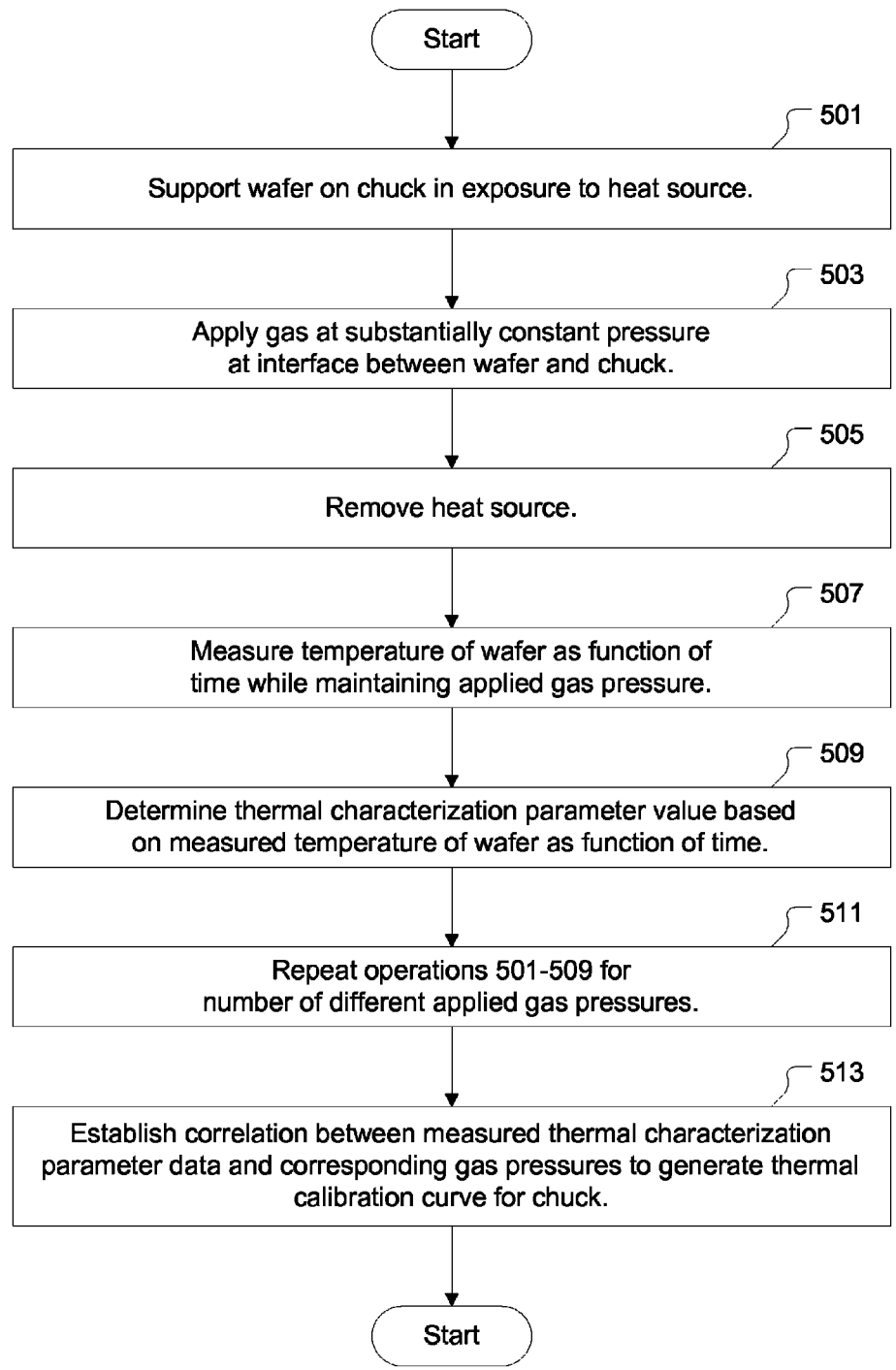
FIG. 5 is an illustration showing a flowchart of a method for performing a thermal calibration of a chuck, in accordance with one embodiment of the present invention.

FIG. 5 is an illustration showing a flowchart of a method for performing a thermal calibration of a chuck, in accordance with one embodiment of the present invention. The method includes an operation 501 for supporting a wafer (or equivalent test object) on the chuck in exposure to a heat source. The method continues with an operation 503 for applying a gas at a substantially constant pressure at an interface between the wafer and the chuck. In an operation 505, the heat source is removed. Then, an operation 507 is performed to measure a temperature of the wafer as a function of time while maintaining the applied gas pressure. During operations 501-507, control parameters of the chuck other than the applied gas pressure are set to values to be applied during use of the chuck in a wafer fabrication process.

The method further includes an operation 509 for determining a thermal characterization parameter value based on the measured temperature of the wafer as a function of time. In one embodiment, the thermal characterization parameter is defined as a time constant within a mathematical model representing the measured temperature of the wafer as a function of time. In another embodiment, the thermal characterization parameter is defined as an effective thermal conductivity value of the chuck. Regardless of the particular thermal characterization parameter embodiment, it should be appreciated that the determined thermal characterization parameter values are directly correlated to the applied gas pressure. In an operation 511, the operations 501-509 are repeated for a number of different applied gas pressures. In one embodiment, the number of different applied gas pressures are within a range extending from about 5 ton to about 100 ton. Following the operation 511, a set of measured thermal characterization parameter data is obtained for a number of applied gas pressures. In an operation 513, a correlation is established between the measured thermal characterization parameter data and the corresponding gas pressures to generate a thermal calibration curve for the chuck.

It should be appreciated that using the generated thermal calibration curve, a gas pressure can be determined for a particular thermal characterization parameter value, vice-versa. Additionally, the thermal characterization parameter represented in the thermal calibration curve for the chuck can be directly correlated to wafer temperatures during the wafer fabrication process. Thus, the thermal calibration curve for the chuck can be represented in an alternative format as in-process wafer temperature versus applied gas pressure.

In an alternate embodiment, the operations 501 through 511 in the method of FIG. 5 are repeated for a number of different values of an additional thermal influencing parameter to be considered in combination with the applied gas pressures. For example, the additional thermal influencing parameter may be a chuck chiller temperature or a chuck heater temperature. In this alternate embodiment, the previously discussed operation 513 is slightly modified to establish a correlation between the determined chuck thermal characterization parameter values and combinations of gas pressure values and additional thermal influencing parameter values to generate a multiple-parameter thermal calibration curve for the chuck. The multiple-parameter thermal calibration curve can be used to tune the chuck to achieve a particular wafer temperature during plasma processing.

Figure 6:
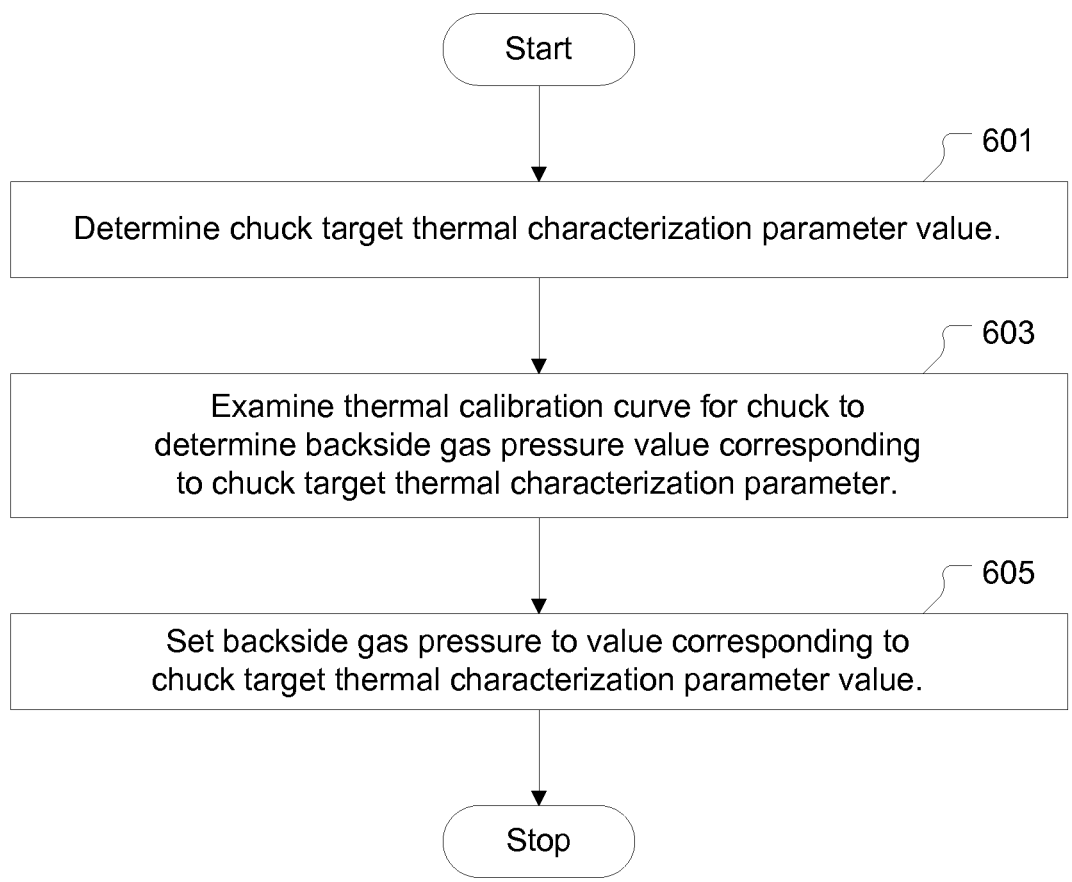
FIG. 6 is an illustration showing a flowchart of a method for controlling wafer temperature during a wafer fabrication process, in accordance with one embodiment of the present invention.

FIG. 6 is an illustration showing a flowchart of a method for controlling wafer temperature during a wafer fabrication process, in accordance with one embodiment of the present invention. In an operation 601, a chuck target thermal characterization parameter value is determined. It should be appreciated that the chuck is to be used to hold the wafer during the wafer fabrication process. The chuck target thermal characterization parameter value corresponds to a target thermal performance of the chuck which results in a target wafer temperature during the wafer fabrication process. In one embodiment, the chuck target thermal characterization parameter value is defined as a target effective thermal conductivity value of the chuck. In another embodiment, the chuck target thermal characterization parameter value is defined as a target time constant value for heat transfer through the chuck.

The method further includes an operation 603 for examining a thermal calibration curve for the chuck to determine a backside gas pressure value corresponding to the chuck target thermal characterization parameter. It should be understood that the backside gas pressure corresponds to a pressure of a gas applied at an interface between the wafer and the chuck. In one embodiment, the gas applied at the interface between the wafer and the chuck is helium. In an operation 605, the backside gas pressure is set to the value corresponding to the chuck target thermal characterization parameter value. Following the operation 605, the fabrication process is performed on the wafer while maintaining the backside gas pressure at the value corresponding to the chuck target thermal characterization parameter value. It should be appreciated that the backside gas pressure serves to control the wafer temperature during the fabrication process.

With respect to initial variability in thermal characteristics among chucks, the method of the present invention for developing and using chuck-specific thermal calibration curves will enable chucks in as-fabricated condition to be tuned to a target heat transfer capability. For example, thermal calibration curves can be developed for each chuck based on its as-fabricated state. Then, the backside gas pressure of each chuck during operation can be set to match a target value for a thermal characterization parameter. Matching of each chuck to the target thermal characterization parameter value will cause each chuck to conduct heat away from the wafer at essentially the same rate. Thus, the wafer temperatures corresponding to the various tuned chucks will be essentially the same.

As the chuck is used over time, the thermal calibration curve for the chuck can be updated to reflect the latest condition of the chuck. Thus, the updated thermal calibration curve will capture chuck property changes that affect thermal performance, such as surface roughness at the wafer-to-chuck interface. It should be appreciated that an update frequency for the thermal calibration curve associated with a particular chuck will be dependent upon how well the thermal calibration curve continues to predict the thermal performance of the chuck. For example, when the backside gas pressure specified by an existing thermal calibration curve begins to yield a different chuck thermal performance, as indicated by measured wafer temperatures, it will be necessary to repeat the thermal calibration curve development process to obtain an updated thermal calibration curve that reflects the latest physical and thermal condition of the chuck.

In wafer fabrication, it is often desirable to run the same wafer process in multiple chambers to get the same resulting wafer condition. If the wafer temperature in each chamber differs due to chuck thermal characteristics, it will be difficult if not impossible to obtain the same resulting wafer condition from each chamber. With the present invention, the chuck in each chamber can be tuned, via backside gas pressure as specified by the corresponding thermal calibration curve, to provide a consistent thermal performance. Thus, the tuned chucks will enable consistent wafer temperatures to be maintained in each chamber during wafer processing. Consequently, the post-process wafer condition associated with each chamber will not exhibit substantial variation as would be expected with in-process wafer temperature variations among chambers.

The present invention can also be embodied as a system for providing wafer temperature control during a wafer fabrication process. The system includes a chuck, a gas controller, and a computing device for controlling the gas controller. The chuck is defined to hold a wafer in exposure to a plasma during a fabrication process. The chuck includes a number of ports to supply a gas at an interface between the wafer and the chuck. The gas controller is defined to control a pressure of the gas supplied at the interface between the wafer and the chuck. The computing device includes thermal calibration data for the chuck. It should be appreciated that in various embodiments the thermal calibration data can be maintained in different formats, such as a table of values or parameters for an equation defined to fit the data. The thermal calibration data specifies a gas pressure setting to be communicated from the computing device to the gas controller to maintain a target wafer temperature. The target wafer temperature is correlated to a particular chuck target thermal characterization parameter value represented by the thermal calibration data. The thermal calibration data for the chuck represents the chuck thermal characterization parameter as a function of the pressure of the gas supplied at the interface between the wafer and the chuck. In one embodiment, the thermal characterization parameter for the chuck is defined as an effective thermal conductivity of the chuck. In another embodiment, the thermal characterization parameter for the chuck is defined as a time constant for heat transfer through the chuck.

It should be appreciated that development and use of the chuck thermal calibration curves enable pre-conditioning of the chuck to limit process drift. Additionally, the chuck thermal calibration curves enable compensation for variation in chuck thermal characteristics as a function of operation time. Furthermore, the chuck thermal calibration curves of the present invention allow the wafer temperature to be controlled using the chuck rather than other non-chuck related process parameters such as RF power, chamber pressure, etc. Due to dependencies between the non-chuck related process parameters, adjustment of the non-chuck related process parameters in an attempt to control wafer temperature can lead to a narrowing of a process window, wherein the process window is defined by an acceptable range of each process parameter capable of affecting the wafer results. Because of the chuck's independence from the process window, the wafer temperature can be controlled by adjusting the overall thermal performance of the chuck without narrowing the process window.

While this invention has been described in terms of several embodiments, it will be appreciated that those skilled in the art upon reading the preceding specifications and studying the drawings will realize various alterations, additions, pet mutations and equivalents thereof. Therefore, it is intended that the present invention includes all such alterations, additions, permutations, and equivalents as fall within the true spirit and scope of the invention.

What is claimed is:

1. A method for performing a thermal calibration of a chuck, comprising:
    (a) supporting a wafer on the chuck in exposure to a heat source;
    (b) applying a gas at a substantially constant pressure at an interface between the wafer and the chuck;
    (c) removing the heat source;
    (d) measuring a temperature of the wafer as a function of time following removal of the heat source while maintaining the applied gas pressure;
    (e) determining a chuck thermal characterization parameter value based on the measured temperature of the wafer as a function of time, wherein the determined chuck thermal characterization parameter value corresponds to the applied gas pressure;
    (f) repeating operations (a) through (e) for a number of different applied gas pressures; and
    (g) establishing a correlation between the determined chuck thermal characterization parameter values and corresponding gas pressures to generate a thermal calibration curve for the chuck.

2. The method of claim 1, further comprising:
setting control parameters of the chuck other than the applied gas pressure to values to be applied during use of the chuck in a wafer fabrication process.

3. The method of claim 1, further comprising:
using the thermal calibration curve for the chuck to determine a particular gas pressure required to obtain a particular chuck thermal characterization parameter, wherein the particular chuck thermal characterization parameter value corresponds to target thermal performance of the chuck.

4. The method of claim 3, wherein the target thermal performance of the chuck corresponds to a target wafer temperature during a wafer fabrication process.

5. The method of claim 1, wherein the heat source is a plasma maintained at a substantially constant power level.

6. The method of claim 1, further comprising:
repeating operations (a) through (f) for a number of different values of an additional thermal influencing parameter to be considered in combination with the applied gas pressures; and
establishing a correlation between the determined chuck thermal characterization parameter values and combinations of gas pressure values and additional thermal influencing parameter values to generate a multiple-parameter thermal calibration curve for the chuck.

7. The method of claim 1, wherein the chuck thermal characterization parameter value is defined as a time constant value within a mathematical model representing the measured temperature of the wafer as a function of time.

8. The method of claim 1, wherein the chuck thermal characterization parameter value is defined as an effective thermal conductivity value of the chuck.

9. The method of claim 1, wherein the number of different applied gas pressures are within a range extending from about 5 torr to about 100 torr.

* * * * *